United States Patent
Lu et al.

(10) Patent No.: US 9,418,955 B2
(45) Date of Patent: Aug. 16, 2016

(54) PLASMA TREATMENT FOR SEMICONDUCTOR DEVICES

(71) Applicant: Taiwan Semiconductor Manufacturing Company, Ltd., Hsin-Chu (TW)

(72) Inventors: Chen-Fa Lu, Kaohsiung (TW); Chung-Shi Liu, Hsin-Chu (TW); Chen-Hua Yu, Hsin-Chu (TW); Wei-Yu Chen, Taipei (TW); Cheng-Ting Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/096,435

(22) Filed: Dec. 4, 2013

(65) Prior Publication Data
US 2014/0131861 A1     May 15, 2014

Related U.S. Application Data

(62) Division of application No. 12/818,890, filed on Jun. 18, 2010, now Pat. No. 8,629,053.

(51) Int. Cl.
*H01L 23/00* (2006.01)
*H01L 23/29* (2006.01)
(Continued)

(52) U.S. Cl.
CPC ............. *H01L 24/13* (2013.01); *H01L 23/293* (2013.01); *H01L 23/3171* (2013.01);
(Continued)

(58) Field of Classification Search
CPC ............. H01L 2924/10253; H01L 2924/00; H01L 2924/01078; H01L 2924/01079; H01L 21/304; H01L 2224/1131; H01L 2224/13099; H01L 2224/131; H01L 2224/13144; H01L 2224/16225; H01L 2224/73253; H01L 23/13
USPC ........... 257/737, E21.001, E21.237, E21.508, 257/E23.004, E23.021, E23.062, E23.069, 257/778, 786; 438/38, 39, 40, 459, 597, 438/613, 622, 652, 674
See application file for complete search history.

(56) References Cited

U.S. PATENT DOCUMENTS

| | | | | | |
|---|---|---|---|---|---|
| 4,539,616 | A | * | 9/1985 | Yuito | ............... G11B 5/17 29/603.25 |
| 5,834,329 | A | * | 11/1998 | Kim | ............... H01S 5/22 438/38 |

(Continued)

FOREIGN PATENT DOCUMENTS

CN     101775207 A     7/2010

OTHER PUBLICATIONS

Fan, W. et al., "A review of studying polymeric membranes by atomic force microscopy," Nuclear Techniques, Mar. 2003, 6 pages, vol. 26, No. 3, China Academic Journal Electronic Publishing House.

*Primary Examiner* — William F Kraig
*Assistant Examiner* — Edward Chin
(74) *Attorney, Agent, or Firm* — Slater Matsil, LLP

(57) ABSTRACT

A semiconductor device having a polymer layer and a method of fabricating the same is provided. A two-step plasma treatment for a surface of the polymer layer includes a first plasma process to roughen the surface of the polymer layer and loosen contaminants, and a second plasma process to make the polymer layer smoother or make the polymer layer less rough. An etch process may be used between the first plasma process and the second plasma process to remove the contaminants loosened by the first plasma process. In an embodiment, the polymer layer exhibits a surface roughness between about 1% and about 8% as measured by Atomic Force Microscopy (AFM) with the index of surface area difference percentage (SADP) and/or has surface contaminants of less than about 1% of Ti, less than about 1% of F, less than about 1.5% Sn, and less than about 0.4% of Pb.

20 Claims, 10 Drawing Sheets

(51) Int. Cl.
*H01L 23/31* (2006.01)
*H01L 23/498* (2006.01)
*H05K 3/28* (2006.01)
*H05K 3/34* (2006.01)
*H05K 3/40* (2006.01)

(52) U.S. Cl.
CPC ............ *H01L 23/498* (2013.01); *H01L 24/03* (2013.01); *H01L 24/11* (2013.01); *H01L 23/49816* (2013.01); *H01L 23/49822* (2013.01); *H01L 24/05* (2013.01); *H01L 2224/0345* (2013.01); *H01L 2224/0362* (2013.01); *H01L 2224/03452* (2013.01); *H01L 2224/03462* (2013.01); *H01L 2224/03831* (2013.01); *H01L 2224/03901* (2013.01); *H01L 2224/0401* (2013.01); *H01L 2224/05572* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05669* (2013.01); *H01L 2224/1147* (2013.01); *H01L 2224/1181* (2013.01); *H01L 2224/1183* (2013.01); *H01L 2224/11622* (2013.01); *H01L 2224/11849* (2013.01); *H01L 2224/11901* (2013.01); *H01L 2224/13111* (2013.01); *H01L 2224/13116* (2013.01); *H01L 2224/93* (2013.01); *H01L 2924/0002* (2013.01); *H01L 2924/00014* (2013.01); *H01L 2924/014* (2013.01); *H01L 2924/0105* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01072* (2013.01); *H01L 2924/01073* (2013.01); *H01L 2924/01074* (2013.01); *H01L 2924/01075* (2013.01); *H01L 2924/01078* (2013.01); *H01L 2924/01079* (2013.01); *H01L 2924/01082* (2013.01); *H01L 2924/01084* (2013.01); *H01L 2924/01322* (2013.01); *H01L 2924/01327* (2013.01); *H01L 2924/12044* (2013.01); *H01L 2924/14* (2013.01); *H01L 2924/1434* (2013.01); *H01L 2924/15311* (2013.01); *H01L 2924/15788* (2013.01); *H01L 2924/181* (2013.01); *H05K 3/28* (2013.01); *H05K 3/3478* (2013.01); *H05K 3/4007* (2013.01)

(56) References Cited

U.S. PATENT DOCUMENTS

| | | | | |
|---|---|---|---|---|
| 6,174,175 B1* | 1/2001 | Behfar | ................ | H01R 12/714 439/91 |
| 6,248,655 B1* | 6/2001 | Machida | ................ | G91B 7/004 438/597 |
| 6,782,897 B2 | 8/2004 | Wang et al. | | |
| 6,802,598 B2* | 10/2004 | Ito | ................ | B41J 2/14201 347/71 |
| 6,953,999 B2* | 10/2005 | Strandberg | .............. | H01L 23/13 257/778 |
| 7,094,705 B2* | 8/2006 | Lin | ................ | H01L 21/321 257/E21.3 |
| 7,105,377 B1* | 9/2006 | Chang | ................ | H01L 21/67121 257/798 |
| 7,192,880 B2* | 3/2007 | Dostalik, Jr. | ...... | H01L 21/31116 257/E21.024 |
| 7,250,678 B2* | 7/2007 | Datta et al. | ..................... | 257/738 |
| 7,485,968 B2* | 2/2009 | Enquist | ............ | H01L 21/76898 257/777 |
| 7,736,973 B2* | 6/2010 | Orimoto | ........... | H01L 27/11521 257/E21.68 |
| 7,781,781 B2* | 8/2010 | Adkisson | .......... | H01L 27/14618 257/84 |
| 7,825,511 B2* | 11/2010 | Daubenspeck | ..... | H01L 23/3192 257/737 |
| 7,893,435 B2* | 2/2011 | Kazlas | ............. | G02F 1/133305 257/59 |
| 8,084,319 B2* | 12/2011 | Peng | .................... | B81C 1/00071 438/223 |
| 8,242,024 B2* | 8/2012 | Chen | ................. | H01L 21/76816 438/712 |
| 2002/0121595 A1* | 9/2002 | Sunner | ................ | H01J 49/0418 250/281 |
| 2003/0219987 A1* | 11/2003 | Wang | ...................... | H01L 24/11 438/720 |
| 2005/0145832 A1* | 7/2005 | Wessling | ................ | B32B 27/34 252/500 |
| 2006/0148233 A1* | 7/2006 | Datta | ................ | H01L 23/49816 438/614 |
| 2006/0175686 A1* | 8/2006 | Murata | ............... | H01L 21/0206 257/642 |
| 2008/0083611 A1* | 4/2008 | Felmetsger | ........... | C23C 14/165 204/192.15 |
| 2008/0314618 A1* | 12/2008 | Shimoosako | ........ | C08G 73/106 174/250 |
| 2009/0152655 A1* | 6/2009 | Laming | ............... | B81C 1/00246 257/416 |
| 2009/0242250 A1* | 10/2009 | Kohda | .................... | B32B 15/08 174/259 |
| 2010/0159645 A1* | 6/2010 | Yanagida | ................ | H01L 21/56 438/113 |
| 2010/0187694 A1* | 7/2010 | Yu | ..................... | H01L 21/76898 257/751 |
| 2011/0012239 A1* | 1/2011 | Gu | ...................... | H01L 21/6836 257/637 |
| 2011/0133284 A1* | 6/2011 | Mitra | .................... | B08B 7/0035 257/368 |
| 2011/0233766 A1* | 9/2011 | Lin | .................... | H01L 21/76877 257/737 |
| 2012/0060915 A1* | 3/2012 | Chan | ................... | H01L 31/0236 136/256 |

* cited by examiner

| Two-Step Plasma Treatment | | | | | Single-Step Plasma Treatment | | | | |
|---|---|---|---|---|---|---|---|---|---|
| Example | Ti | F | Sn | Pb | Example | Ti | F | Sn | Pb |
| 1 | <0.1 | <0.1 | 0.26 | 0.03 | 1 | 3.9 | 2.8 | 2.4 | 0.4 |
| 2 | <0.1 | <0.1 | 0.41 | 0.07 | 2 | 3.5 | 2.9 | 6.4 | 0.8 |
| 3 | <0.1 | <0.1 | 0.4 | 0.1 | 3 | 3.4 | 2.9 | 5.8 | 0.7 |
| 4 | <0.1 | <0.1 | 0.3 | 0 | 4 | 2.1 | 14.8 | 2.4 | 0.9 |
| 5 | <0.1 | <0.1 | 0.4 | 0.1 | 5 | 7.1 | 1.4 | 3.1 | 0.9 |
| 6 | <0.1 | <0.1 | 0.3 | 0.1 | 6 | 2.9 | 14 | 2.1 | 0.8 |

Fig. 10

PLASMA TREATMENT FOR SEMICONDUCTOR DEVICES

TECHNICAL FIELD

This application is a divisional of U.S. patent application Ser. No. 12/818,890, filed on Jun. 18, 2010, entitled "Plasma Treatment for Semiconductor Devices," which application is hereby incorporated herein by reference in its entirety.

BACKGROUND

This disclosure relates generally to semiconductor devices and, more particularly, to plasma-treated surfaces for semiconductor devices to reduce or prevent contaminants.

Since the invention of the integrated circuit (IC), the semiconductor industry has experienced continued rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

The past few decades have also seen many shifts in semiconductor packaging that have impacted the entire semiconductor industry. The introduction of surface-mount technology (SMT) and ball grid array (BGA) packages were generally important steps for high-throughput assembly of a wide variety of IC devices, while at the same time allowing for reduction of the pad pitch on the printed circuit board. Conventionally packaged ICs have a structure basically interconnected by fine gold wire between metal pads on the die and electrodes spreading out of molded resin packages. On the other hand, some CSP or BGA packages rely on bumps of solder to provide an electrical connection between contacts on the die and contacts on a substrate, such as a packaging substrate, a printed circuit board (PCB), another die/wafer, or the like. Other CSP or BGA packages utilize a solder ball or bump placed onto a conductive pillar, relying on the soldered joint for structural integrity. In these situations, it is typical to cover the substrate around the solder balls or bumps with a polymer material to protect the surface of the substrate. An underfill material is also typically placed between the IC and the underlying substrate, e.g., packaging substrate, to provide mechanical strength and to protect the IC from environmental contaminants.

In some devices, the polymer surface was purposefully roughened, thereby creating a coral-like surface. This roughened surface was believed to create a stronger bond between the polymer material and the underfill material, reducing delamination between the underfill material and the polymer surface. It has been found, however, that this roughened surface also induces additional contaminants during processing. For example, the roughened surface appears to increase the amount of tape residue from applying tape during a backside thinning process.

BRIEF DESCRIPTION OF THE DRAWINGS

For a more complete understanding of the embodiments, and the advantages thereof, reference is now made to the following descriptions taken in conjunction with the accompanying drawings, in which:

FIG. 10 are tables comparing the contaminants found in samples using a single-step plasma process and a two-step plasma process.

DETAILED DESCRIPTION

Figure 1:
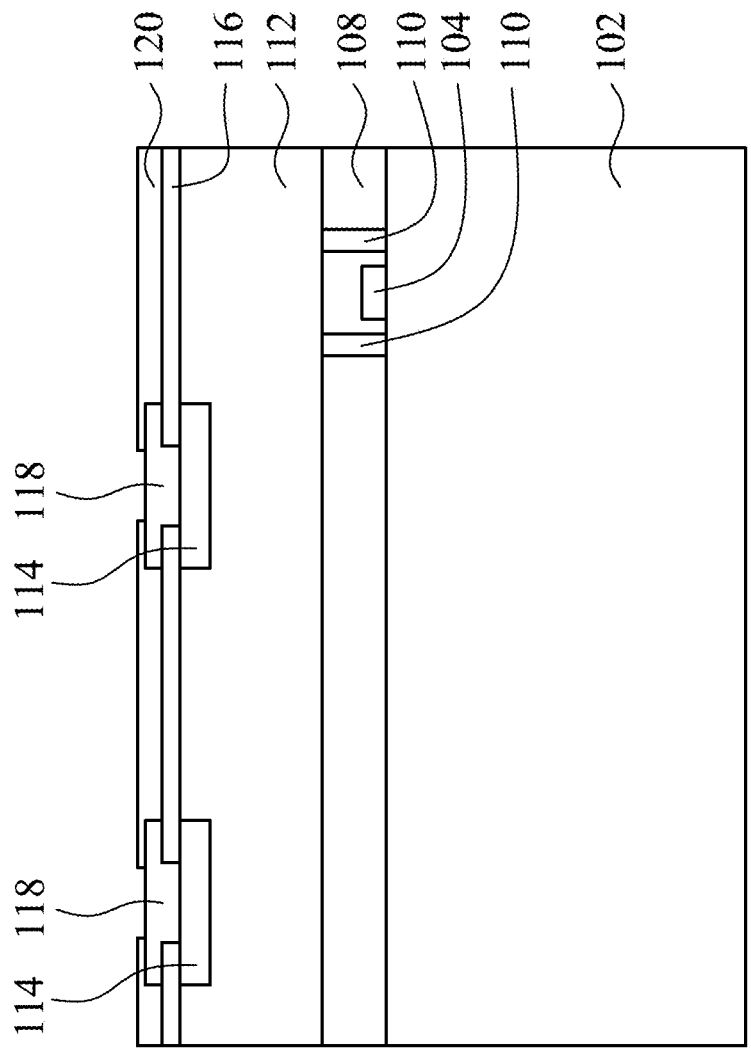
FIGS. 1-7 illustrate various intermediate stages of a method of forming a semiconductor device in accordance with an embodiment.

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Embodiments described herein relate to the use of a two-step plasma treatment for polymer surfaces that provide a surface free of contaminants for use with semiconductor devices. As will be discussed below, embodiments are disclosed that utilize a first plasma treatment process to first remove contaminants from a surface of a substrate and a second plasma treatment process to make the surface smoother, wherein the substrate may be a die, wafer, printed circuit board, packaging substrate, or the like. It is believed that the process described herein allow for a substantially contaminant free surface as well as providing a smoother surface upon which further contamination from, for example, a taping process is reduced and/or prevented. Throughout the various views and illustrative embodiments, like reference numerals are used to designate like elements.

FIGS. 1-7 illustrate various intermediate stages of a method of forming a semiconductor device in accordance with an embodiment. Referring first to FIG. 1, a portion of a substrate 102 having optional electrical circuitry 104 formed thereon is shown in accordance with an embodiment. The substrate 102 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The optional electrical circuitry 104 formed on the substrate 102 may be any type of electrical circuitry suitable for a particular application. In an embodiment, the electrical circuitry 104 includes electrical devices formed on the substrate 102 with one or more dielectric layers overlying the electrical devices. Metal layers may be formed between dielectric layers to route electrical signals between the electrical devices. Electrical devices may also be formed in one or more dielectric layers.

For example, the electrical circuitry 104 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application.

Also shown in FIG. 1 is an inter-layer dielectric (ILD) layer 108. The ILD layer 108 may be formed, for example, of a low-K dielectric material, such as phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), and plasma-enhanced CVD (PECVD). It should also be noted that the ILD layer 108 may comprise a plurality of dielectric layers.

Contacts, such as contacts 110, are formed through the ILD layer 108 to provide an electrical contact to the electrical circuitry 104. The contacts 110 may be formed, for example, by using photolithography techniques to deposit and pattern a photoresist material on the ILD layer 108 to expose portions of the ILD layer 108 that are to become the contacts 110. An etch process, such as an anisotropic dry etch process, may be used to create openings in the ILD layer 108. The openings may be lined with a diffusion barrier layer and/or an adhesion layer (not shown), and filled with a conductive material. In an embodiment, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 110 as illustrated in FIG. 1.

One or more inter-metal dielectric (IMD) layers 112 and the associated metallization layers (not shown) are formed over the ILD layer 108. Generally, the one or more IMD layers 112 and the associated metallization layers are used to interconnect the electrical circuitry 104 to each other and to provide an external electrical connection. The IMD layers 112 may be formed of a low-K dielectric material, such as FSG formed by PECVD techniques or high-density plasma CVD (HDPCVD), or the like, and may include intermediate etch stop layers. Contacts 114 are provided in the uppermost IMD layer to provide external electrical connections.

It should be noted that one or more etch stop layers (not shown) may be positioned between adjacent ones of the dielectric layers, e.g., the ILD layer 108 and the IMD layers 112. Generally, the etch stop layers provide a mechanism to stop an etching process when forming vias and/or contacts. The etch stop layers are formed of a dielectric material having a different etch selectivity from adjacent layers, e.g., the underlying semiconductor substrate 102, the overlying ILD layer 108, and the overlying IMD layers 112. In an embodiment, etch stop layers may be formed of SiN, SiCN, SiCO, CN, combinations thereof, or the like, deposited by CVD or PECVD techniques.

A protective layer 116 may be formed of a dielectric material, such as SiN, a plasma-enhance oxide (PEOX), a plasma-enhanced SiN (PE-SiN), undoped silicate glass (USG), plasma-enhanced USG (PE-USG), or the like, and patterned over the surface of the uppermost IMD layer 112 to provide an opening over the contacts 114 and to protect the underlying layers from various environmental contaminants. Thereafter, conductive pads 118 are formed and patterned over the protective layer 116. The conductive pads 118 provide an electrical connection upon which a UBM structure, such as a copper pillar structure, may be formed for external connections. The conductive pads 118 may be formed of any suitable conductive materials, such as copper, tungsten, aluminum, silver, combinations thereof, or the like.

One or more passivation layers, such as a first passivation layer 120, are formed and patterned over the conductive pads 118 as illustrated in FIG. 1. The first passivation layer 120 may be formed of a dielectric material, such as SiN, USG, PE-USG, PE-SiN, combinations thereof, and/or the like, by any suitable method, such as CVD, physical vapor deposition (PVD), or the like. In an embodiment, the passivation layer 120 comprises a multi-layer structure of SiN and PE-USG.

One of ordinary skill in the art will appreciate that a single layer of conductive pads and a passivation layer are shown for illustrative purposes only. As such, other embodiments may include any number of conductive layers and/or passivation layers. Furthermore, it should be appreciated that one or more of the conductive layers may act as a redistribution layer (RDL) to provide the desired pin or ball/bump layout.

Any suitable process may be used to form the structures discussed above and will not be discussed in greater detail herein. As one of ordinary skill in the art will realize, the above description provides a general description of the features of an embodiment and that numerous other features may be present. For example, other circuitry, liners, barrier layers, under-bump metallization configurations, and the like, may be present. The above description is meant only to provide a context for embodiments discussed herein and is not meant to limit the disclosure or the scope of any claims to those specific embodiments.

It should be noted that the substrate 102 in the embodiment discussed above is an embodiment in which the substrate 102 is a portion of an integrated circuit die. In other embodiments, the substrate 102 may be an interposer (with or without active and/or passive electrical elements formed thereon), a packaging substrate, a laminate substrate, a high-density interconnect, or the like. These other embodiments may or may not have the various layers described above and may have additional layers.

Figure 2:
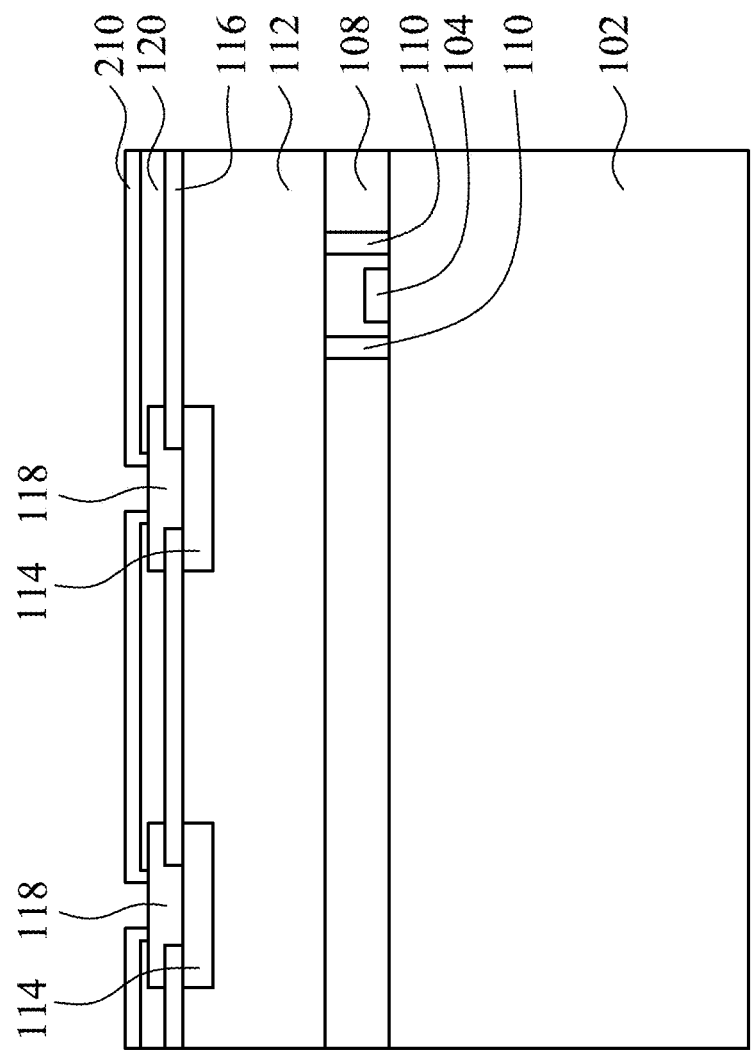

FIG. 2 illustrates a second passivation layer 210 formed over the first passivation layer 120 and patterned to expose at least a portion of the conductive pads 118. The second passivation layer 210 may be, for example, a polymer (e.g., polyimide, polybenzoxasole, or the like) formed by any suitable process, such as a lithography coater process, or the like.

Figure 3:
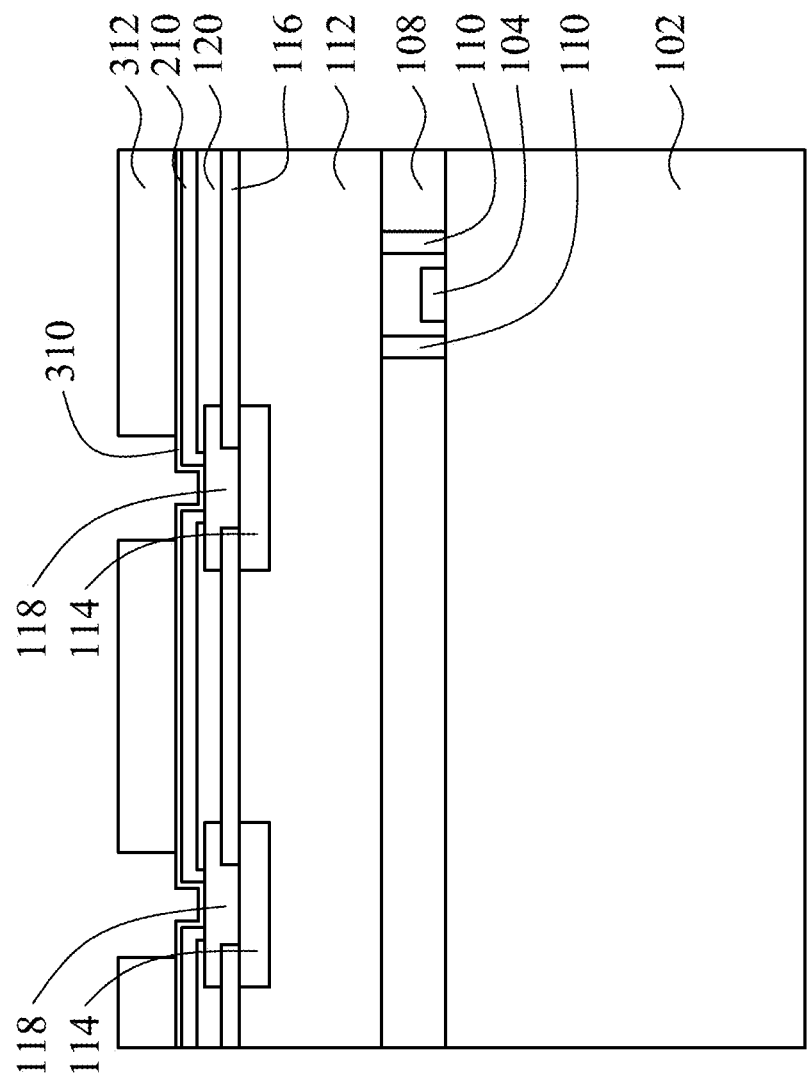

FIG. 3 illustrates an under bump metallization (UBM) seed layer 310 deposited over the surface of the second passivation layer 210. The UBM seed layer 310 is a thin layer of a conductive material that aids in the formation of a thicker layer during subsequent processing steps. In an embodiment, the UBM seed layer 310 may be formed by depositing one or more thin conductive layer, such as a thin layer of Cu, Ti, Ta, TiN, TaN, combinations thereof, or the like, using CVD or PVD techniques. For example, in an embodiment, a layer of Ti is deposited by a PVD process to form a barrier film and a layer of Cu is deposited by a PVD process over the layer of Ti. The layer of Ti helps prevent or reduce the diffusion of Cu into the underlying layers. Other materials, thicknesses, and processes may be used.

Thereafter, as illustrated in FIG. 3, a patterned mask 312 is formed and patterned over the UBM seed layer 310 in accordance with an embodiment. The patterned mask 312 defines the lateral boundaries of the conductive pillar to be subsequently formed as discussed in greater detail below. The patterned mask 312 may be a patterned photoresist mask, hard mask, a combination thereof, or the like.

Figure 4:
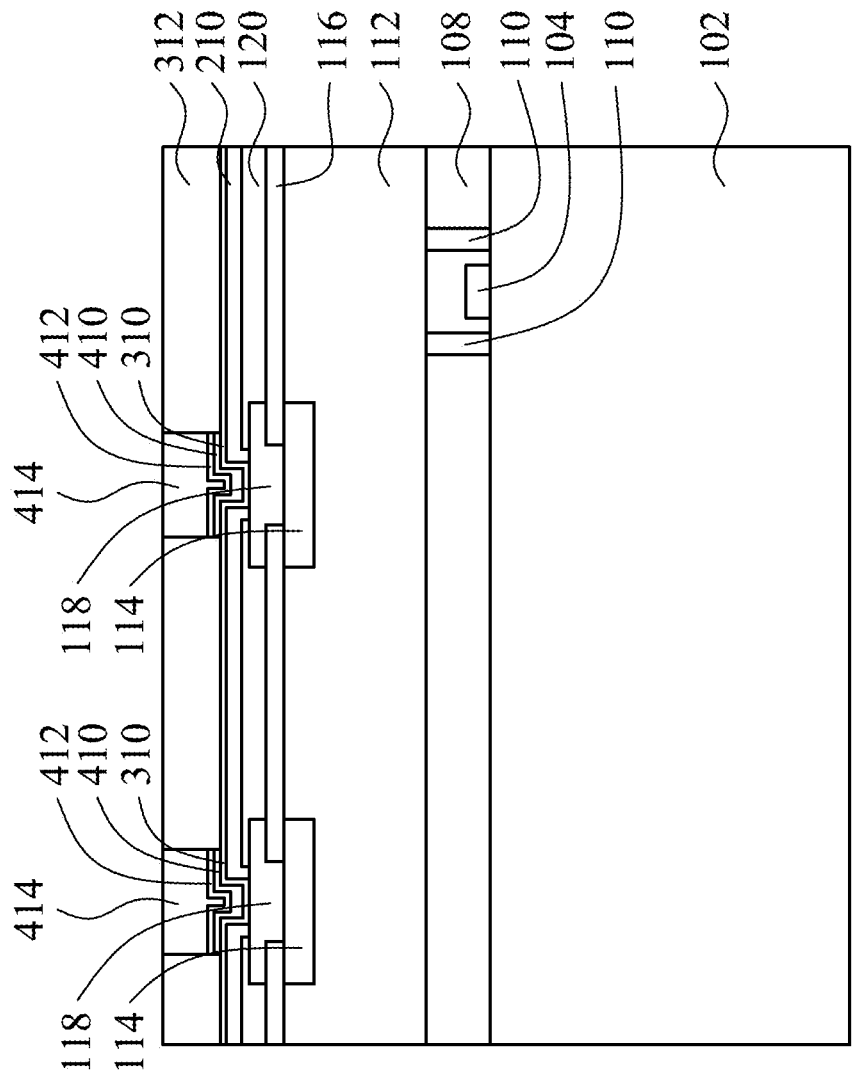

FIG. 4 illustrates the formation of a conductive pillar 410 in accordance with an embodiment. The conductive pillar 410 may be formed of any suitable conductive material, including Cu, Ni, Pt, Al, combinations thereof, or the like, and may be formed through any number of suitable techniques, including PVD, CVD, electrochemical deposition (ECD), molecular beam epitaxy (MBE), atomic layer deposition (ALD), electroplating, and the like. It should be noted that in some embodiments, such as those that deposit a conformal layer over the entire surface of the wafer (e.g., PVD and CVD), it may be desirable to perform an etching or planarization process (e.g., a chemical mechanical polishing (CMP)) to remove excess conductive material from the surface of the patterned mask 312.

It should also be noted that the conductive pillar 410 is illustrated as a thin layer for illustrative purposes only. In other embodiments, the conductive pillar 410 may be considerably thicker, such as having a thickness between about 20 μm and about 50 μm. The conductive pillar 410 may be any thickness sufficient for a desired application. The conductive pillar 410 may also have various shapes.

FIG. 4 also illustrates formation of an optional conductive cap layer 412 formed over the conductive pillar 410. As described in greater detail below, solder material is formed over the conductive pillar 410. During the soldering process, an inter-metallic compound (IMC) layer (not shown) may be naturally formed at the joint between the solder material and the underlying surface. It has been found that some materials may create a stronger, more durable IMC layer than others. As such, it may be desirable to form a cap layer, such as the conductive cap layer 412, to provide an IMC layer having more desirable characteristics. For example, in an embodiment in which the conductive pillar 410 is formed of copper, a conductive cap layer 412 formed of nickel may be desirable. Other materials, such as Pt, Au, Ag, combinations thereof, or the like, may also be used. The conductive cap layer 412 may be formed through any number of suitable techniques, including PVD, CVD, ECD, MBE, ALD, electroplating, and the like.

Furthermore, FIG. 4 also illustrates formation of solder material 414. In an embodiment, the solder material 414 comprises SnPb, a high-Pb material (e.g., $Pb_{95}Sn_5$), a Sn-based solder, a lead-free solder, eutectic solder, or other suitable conductive material.

Figure 5:
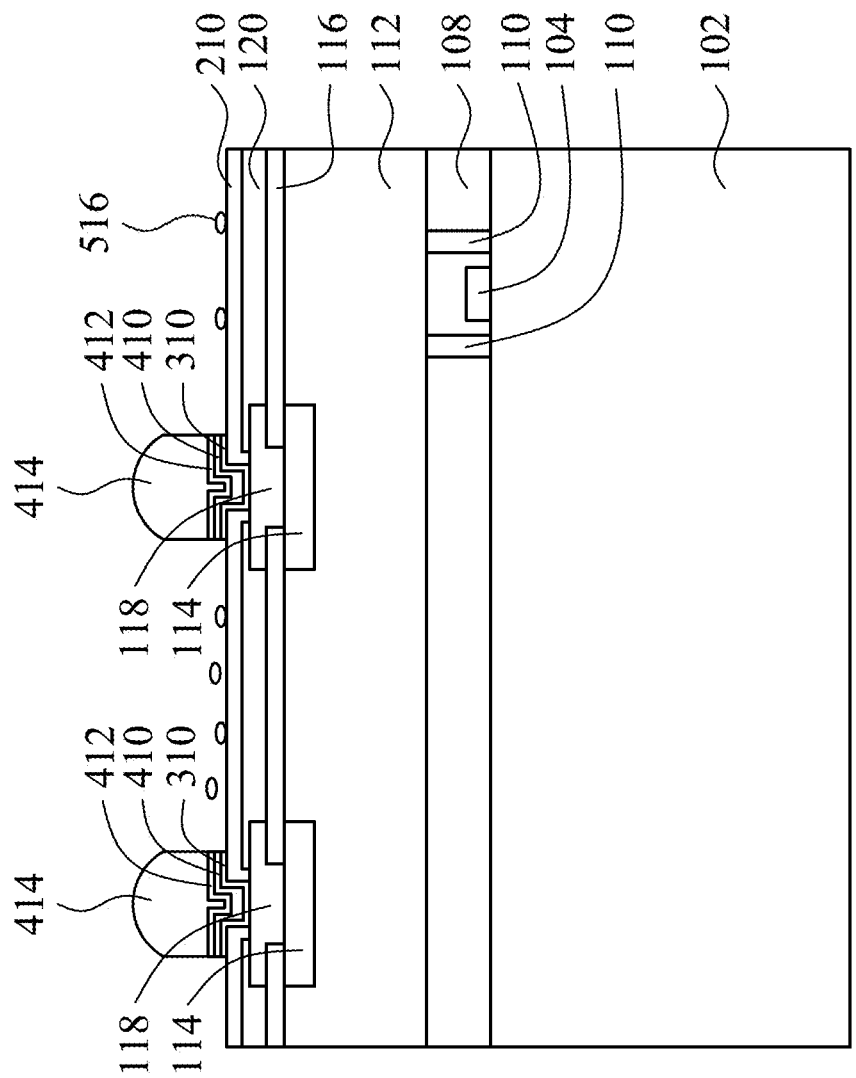

Thereafter, as illustrated in FIG. 5, the patterned mask 312 (see FIG. 4) may be removed. In embodiments in which the patterned mask 312 is formed from photoresist materials, the photoresist may be stripped by, for example, a chemical solution such as a mixture of ethyl lactate, anisole, methyl butyl acetate, amyl acetate, cresol novolak resin, and diazo photoactive compound (referred to as SPR9), or another stripping process. A first UMB etch process may be performed to remove exposed portions of the UBM seed layer 310 from the surface of the second passivation layer 210. In an embodiment in which the UBM seed layer 310 comprises a Ti layer and a Cu layer, a wet dip in a chemical solution of phosphoric acid ($H_3PO_4$) and hydrogen peroxide ($H_2O_2$), referred to as DPP, with 1% hydrofluoric (HF) acid, or another cleaning process, may be used.

As illustrated in FIG. 5, contaminants 516 may remain on the surface of the second passivation layer 210, even after the cleaning process described above. To remove these contaminants, one or more plasma treatments are performed. In an embodiment, a first plasma treatment is performed to slightly roughen the surface of the second passivation layer 210, thereby loosening the contaminants 516. A second plasma treatment is performed subsequently to reduce the roughness, but not completely, of the second passivation layer 210.

In an embodiment, the first plasma treatment comprises a $N_2$ plasma treatment using an $N_2$ flow rate of about 100 sccm to about 1000 sccm at a pressure of about 16 Pa to about 100 Pa with a microwave power of about 500 Watts to about 2000 Watts and an RF power of about 250 Watts to about 500 Watts. This $N_2$ plasma treatment may be performed for about 10 seconds to about 90 seconds to sufficiently roughen the second passivation layer 210 and loosen the contaminants 516.

In another embodiment, the first plasma treatment comprises a $CF_4/O_2$ plasma treatment using a $CF_4$ flow rate of about 50 sccm to about 200 sccm and an $O_2$ flow rate of about 50 sccm to about 200 sccm at a pressure of about 16 Pa to about 100 Pa with a microwave power of about 500 Watts to about 2000 Watts and an RF power of about 100 Watts to about 400 Watts. This $CF_4/O_2$ plasma treatment may be performed for about 10 seconds to about 90 seconds to sufficiently roughen the second passivation layer 210 and loosen the contaminants 516.

Thereafter, a second UBM etch process may be performed. After the contaminants have been loosened by the first plasma treatment, the second UBM etch process may be used to remove the loosened contaminants. In an embodiment in which the UBM seed layer 310 comprises a Ti layer and a Cu layer, the second UBM etch process may comprise a wet dip a 1% HF acid, or another cleaning process, may be used. It is believed that when the UBM seed layer 310 comprises a Ti layer and a Cu layer, the contaminants 516 are mostly Ti contaminants. As such, the wet dip in 1% HF acid is designed to mainly etch the Ti contaminants. If other contaminants are found, then other etchants may be used as well, such as the DPP solution to remove Cu contaminants.

Figure 6:
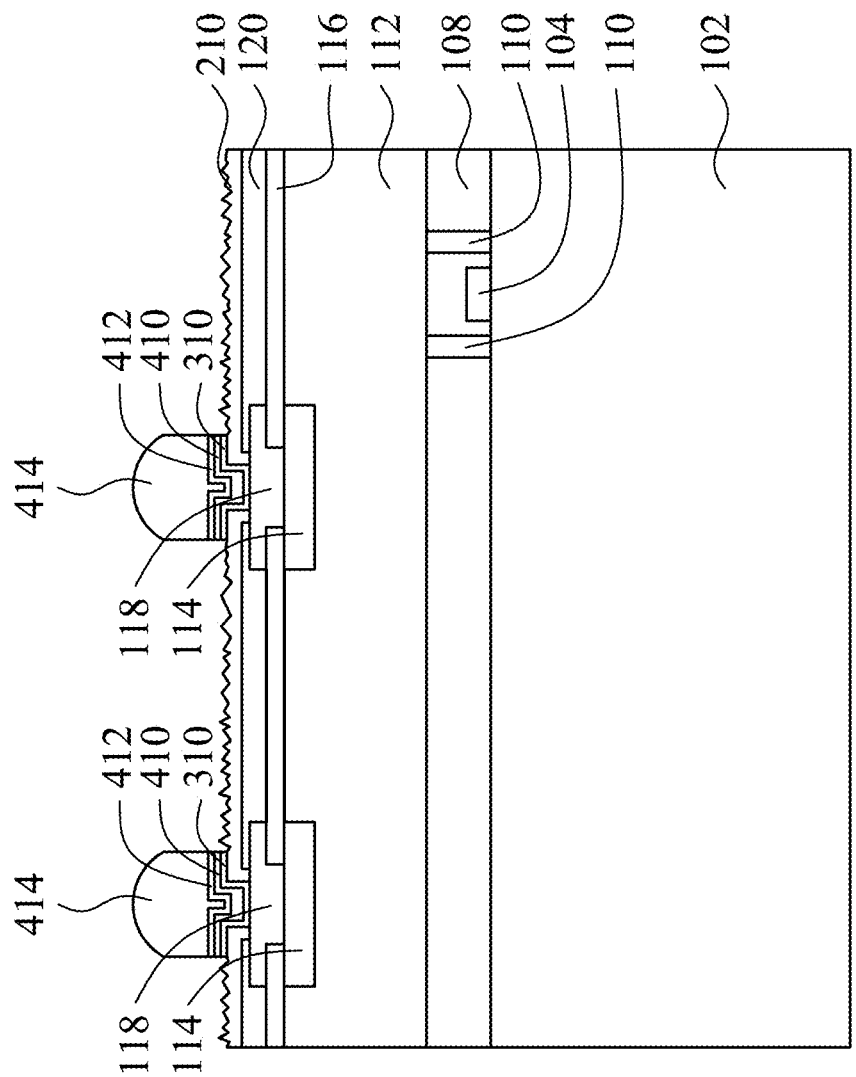

FIG. 6 illustrates the surface roughness of the second passivation layer 210 and the removal of the contaminants 516 (see FIG. 5) after the first plasma treatment and the second UBM etch process. An $O_2$ plasma treatment may also be performed at this stage to remove any by-products that may have formed as a result of a reaction between the plasma treatment and the material (e.g., polymer) of the protective layer 210. FIG. 6 also illustrates a solder reflow process.

Figure 7:
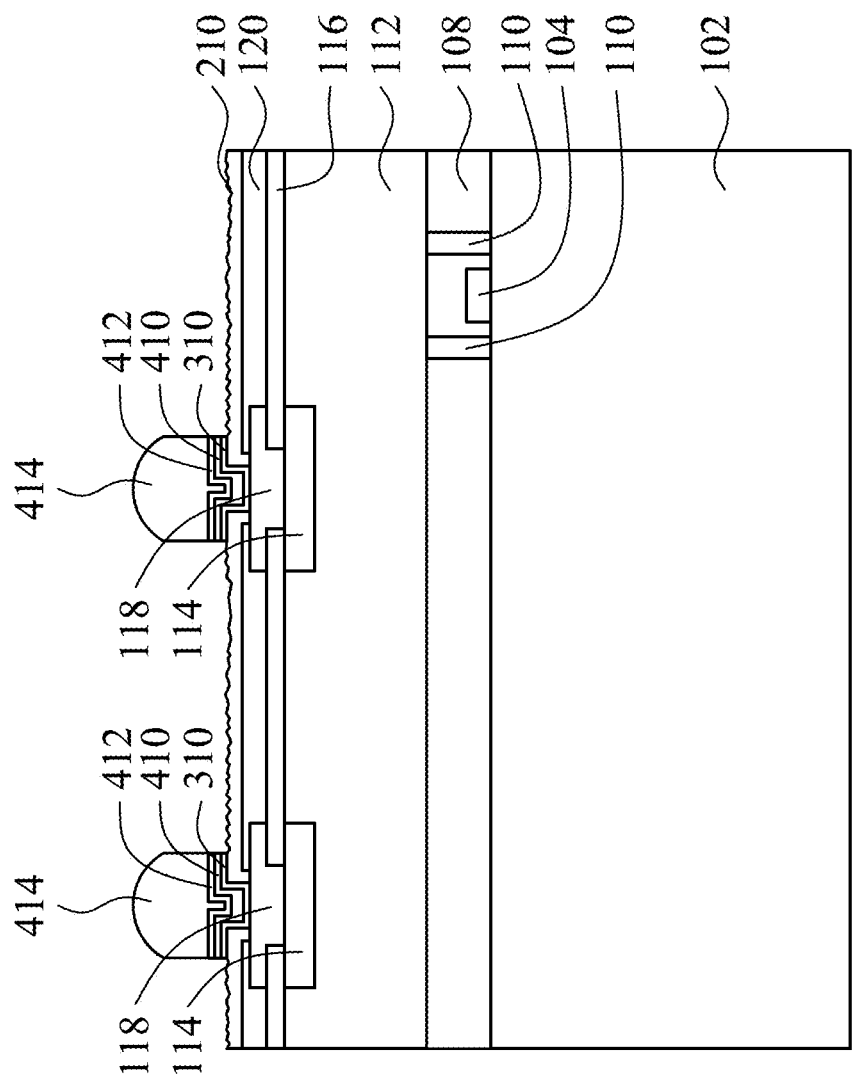

FIG. 7 illustrates a second plasma treatment in accordance with an embodiment. As discussed above, it has been found that applying a tape or other adhesive for subsequent processing, such as backside thinning, to a rough surface, such as that used in other systems, often results in tape residue remaining on the rough surface of the protective layer 210, possibly causing delamination between the second passivation layer 210 and an underfill material. The tape residue on the solder material 414 may also cause a cold joint. In these situations, it may be desirable to perform a second plasma treatment to make the surface of the second passivation layer 210 smoother or to make the surface of the second passivation layer 210 less rough. This smoother surface is less likely to cause tape residue.

In an embodiment, the second plasma treatment comprises a $N_2$ plasma treatment using an $N_2$ flow rate of about 100 sccm to about 1000 sccm at a pressure of about 16 Pa to about 100 Pa with a microwave power of about 500 Watts to about 2000 Watts and an RF power of about 50 Watts to about 250 Watts. This $N_2$ plasma treatment may be performed for about 10 seconds to about 90 seconds.

In another embodiment, the second plasma treatment comprises an $Ar/O_2$ plasma treatment using a Ar flow rate of about 50 sccm to about 200 sccm and an $O_2$ flow rate of about 50 sccm to about 200 sccm at a pressure of about 16 Pa to about 100 Pa with a microwave power of about 0 Watts to about 1000 Watts and an RF power of about 50 Watts to about 250 Watts. This $Ar_2/O_2$ plasma treatment may be performed for about 10 seconds to about 90 seconds.

Figure 8:
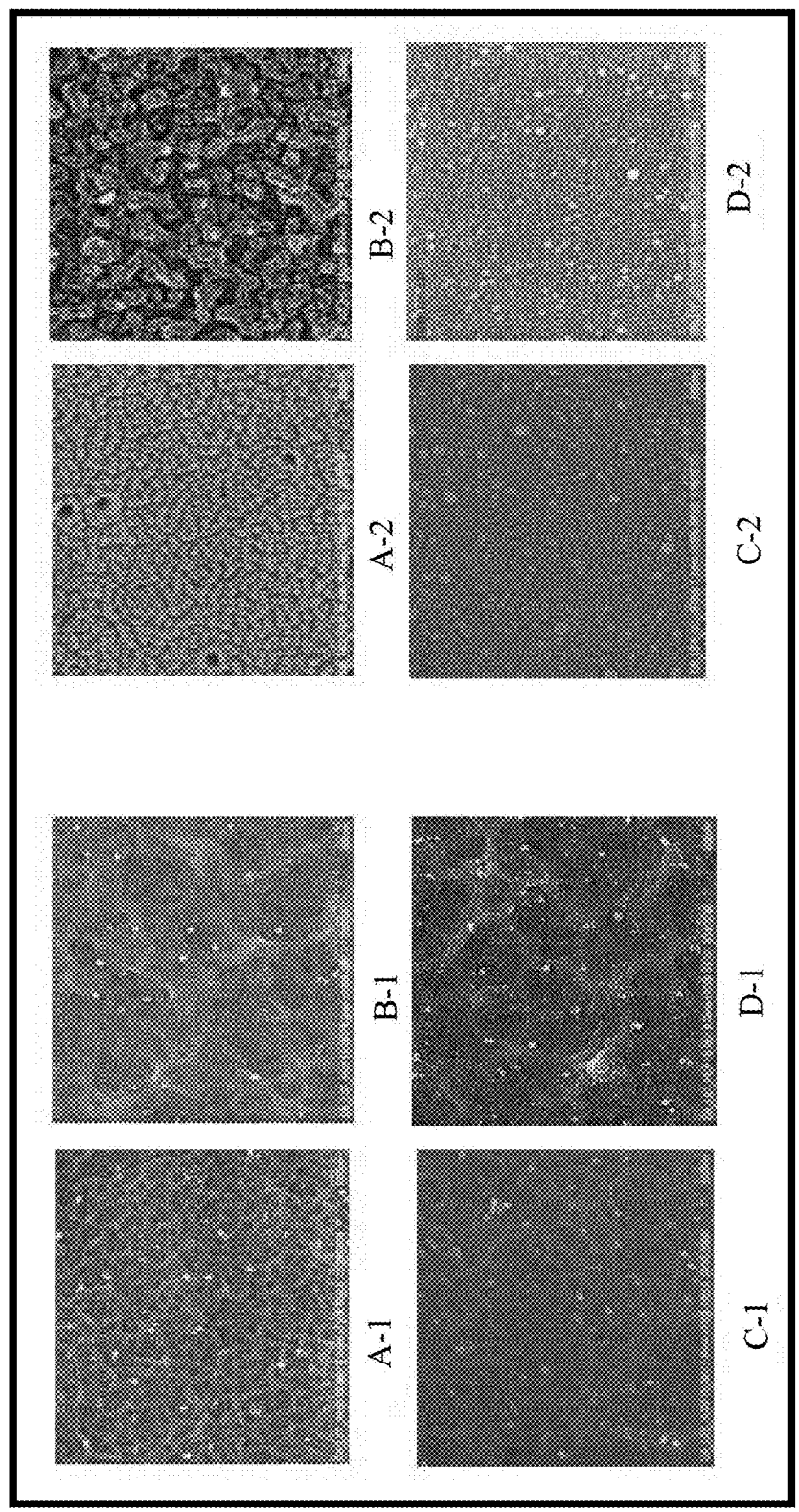
FIG. 8 includes photographs of surfaces fabricated using a single-step plasma process and a two-step plasma process.

FIG. 8 illustrates results that may be obtained by embodiments such as those discussed herein. FIGS. 8A-1 through 8D-1 illustrate images obtained by 100K Scanning Electron Microscope (SEM) of a polymer surface after being subjected to a two-step plasma process such as that described above. The surface roughness of FIGS. 8A-1 through 8D-1 were measured to have a surface roughness of 2.84%, 2.92%, 2.2%, and 3.9%, respectively, as measured by Atomic Force Microscopy (AFM) with the index of the surface area difference percentage (SADP). Generally, SADP is an equation that may be used to measure the roughness of a three-dimensional surface that is calculated by dividing the difference between the three-dimensional area and the two-dimensional area by the two-dimensional area, and multiplying the result by 100, or in other words, (((3D area−2D area)/2D area)*100).

In comparison, FIGS. 8A-2 through 8D-2 illustrate images obtained by 100K SEM of a polymer surface after performing a single roughening plasma treatment. The surface roughness of these surfaces were measured as 13.9%, 22.5%, 12.3%, and 9.41%, respectively, as measured by the SAPD.

Figure 9:
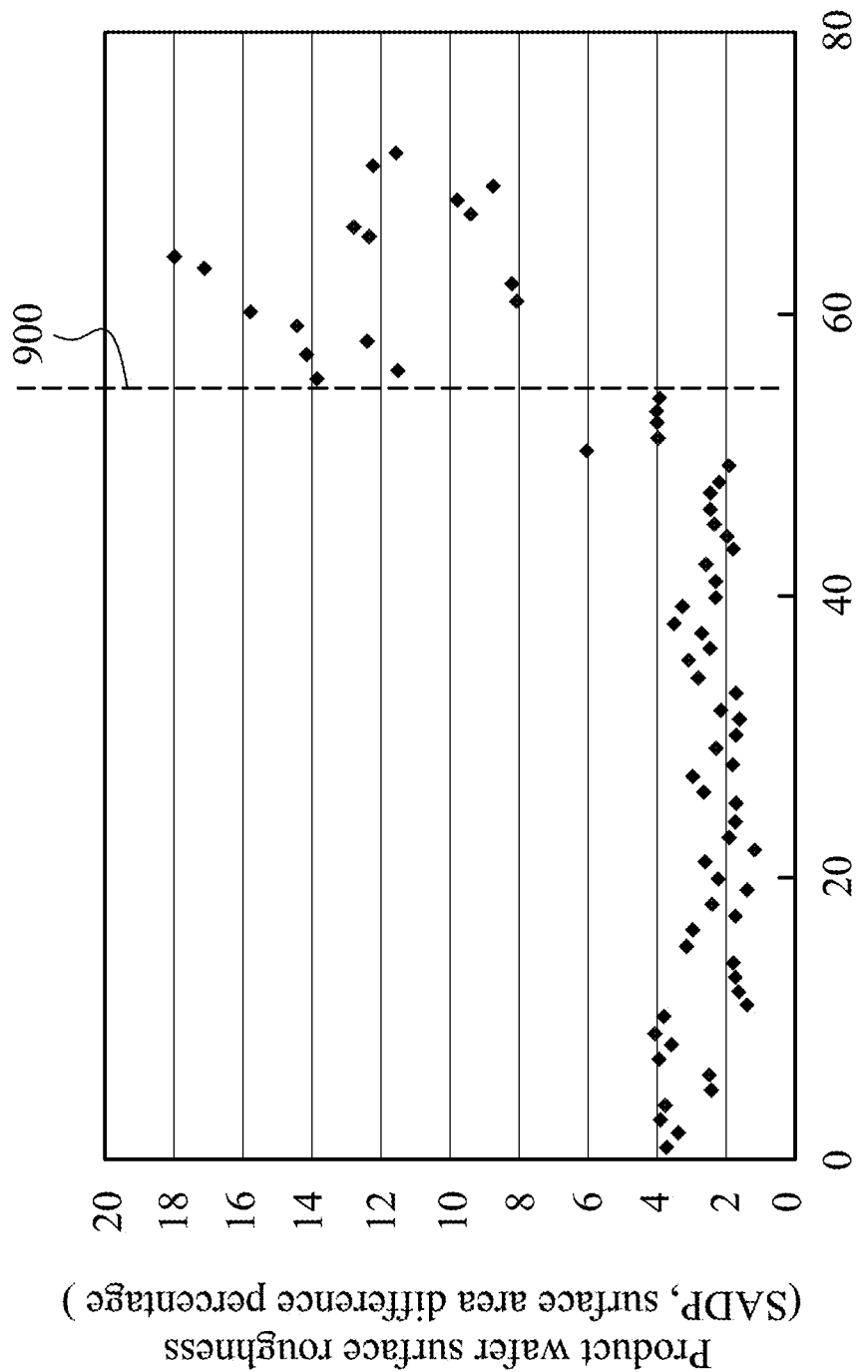
FIG. 9 is a graph comparing the surface roughness of samples fabricated using a single-step plasma process and a two-step plasma process.

FIG. 9 illustrates the difference in surface roughness of the second passivation layer 210 after a two-step plasma process as compared to a single-step plasma process. In particular, the samples to the left of the dotted line 900 represent the surface roughness of the second passivation layer 210 after using a two-step process such as those discussed above. The samples to the right of the dotted line 900 represent the surface roughness of a protective layer seen previous systems using a single plasma process. As illustrated in FIG. 9, the two-step plasma process results in a surface roughness of about 1% to about 8%, while the one-step plasma process resulted in a surface roughness of greater than 8%.

FIG. 10 illustrates two tables identifying the composition of the surface of the second passivation layer 210 using a two-step plasma treatment and a single-step plasma treatment. Table 1004 illustrates the amounts of Ti, F, Sn, and Pb that were found on the surface of a protective layer after a single-step plasma treatment, and table 1002 illustrates the amounts of those elements after a two-step plasma treatment, as measured by an X-ray Photoelectron Spectroscopy (XPS). As can be seen in FIG. 10, the two-step plasma process significantly reduces the amount of all of these elements.

It is believed that two-step plasma process results in a surface roughness such that the UBM seed layer residue is effectively removed, but yet obtains a surface roughness that reduces or prevents adhesive contaminants from, for example, tape.

In an embodiment, a two-step plasma treatment process for providing a polymer layer having a surface with fewer contaminants and less roughness is provided. After performing an etch process to form an under-bump metallization (UBM) structure over the polymer layer, a first plasma treatment process is performed. The first plasma treatment process roughens the surface of the polymer layer and loosens contaminants. An etch process may be performed to remove the loosened contaminants. A second plasma treatment process is then performed to make the polymer surface smoother, or make the surface of the polymer layer less rough. In an embodiment, the polymer layer exhibits a surface roughness between about 1% and about 8% as measured by surface area difference percentage (SADP) and/or has surface contaminants of less than about 1% of Ti, less than about 1% of F, about less than 1.5% Sn, and/or less than about 0.4% of Pb.

Other embodiments are disclosed.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A semiconductor structure comprising:
    a substrate having a contact pad formed thereon;
    a polymer layer over the substrate, the polymer layer having an opening that exposes at least a portion of the contact pad; and
    an under bump metallization (UBM) structure extending through the opening and being in electrical contact with the contact pad, a first surface of a first portion of the polymer layer having a first surface roughness and a second surface of a second portion of the polymer having a second surface roughness different than the first surface roughness, the first portion contacting the second portion, the first surface being completely covered by the UBM, the second surface abutting the first surface and being uncovered by the UBM, the second surface roughness being between about 1% and about 8% as measured by Atomic Force Microscopy (AFM) with the index of surface area difference percentage (SADP), the SADP being based upon a three-dimensional surface area and a two-dimensional surface area of a same surface.

2. The semiconductor structure of claim 1, wherein the polymer layer comprises polyimide.

3. The semiconductor structure of claim 1, wherein the polymer layer comprises polybenzoxasole.

4. The semiconductor structure of claim 1, wherein the polymer layer has surface contaminants of less than about 1% of Ti, less than about 1% of F, less than about 1.5% of Sn, and less than about 0.4% of Pb.

5. The semiconductor structure of claim 1, further comprising a conductive bump in electrical contact with the UBM structure.

6. The semiconductor structure of claim 5, further comprising a conductive pillar interposed between the conductive bump and the UBM structure.

7. The semiconductor structure of claim 1, wherein the UBM structure comprises a Ti layer and a Cu layer.

8. A semiconductor structure comprising:
    a substrate having a contact pad formed thereon; and
    a polymer layer over the substrate, the polymer layer being patterned to expose at least a portion of the contact pad, the polymer layer having surface contaminants, the surface contaminants comprising Ti contaminants greater than 0 and less than about 1%, F contaminants greater than 0 and less than about 1%, Sn contaminants greater than 0 and less than about 1.5%, and Pb contaminants greater than 0 and less than about 0.4%.

9. The semiconductor structure of claim 8, wherein the polymer layer has a surface roughness between about 1% and about 8% as measured by Atomic Force Microscopy (AFM) with the index of surface area difference percentage (SADP).

10. The semiconductor structure of claim 8, wherein the polymer layer comprises polyimide.

11. The semiconductor structure of claim 8, wherein the polymer layer comprises polybenzoxasole.

12. The semiconductor structure of claim 8, wherein the contact pad comprises aluminum.

13. The semiconductor structure of claim 8, further comprising an under bump metallization (UBM) structure extending over the polymer layer and in electrical contact with the contact pad.

14. A semiconductor structure comprising:
a substrate having a contact pad formed thereon;
a polymer layer over the substrate, the polymer layer having a first portion having a first surface roughness and a second portion having a second surface roughness, the first portion contacting the second portion, the second surface roughness being between about 1% and about 8% as measured by Atomic Force Microscopy (AFM) with the index of surface area difference percentage (SADP), the SADP being based upon a three-dimensional surface area and a two-dimensional surface area of a same surface, the polymer layer having surface contaminants of less than about 1% of Ti, less than about 1% of F, less than about 1.5% Sn, and less than about 0.4% of Pb, the polymer layer having an opening that exposes at least a portion of the contact pad; and
an under bump metallization (UBM) structure extending through the opening and being in electrical contact with the contact pad, wherein the first portion is completely covered by the UBM, the second portion and the second surface roughness extending from the UBM to an adjacent UBM.

15. The semiconductor structure of claim 14, wherein the polymer layer comprises polyimide.

16. The semiconductor structure of claim 14, wherein the polymer layer comprises polybenzoxasole.

17. The semiconductor structure of claim 14, further comprising a conductive bump in electrical contact with the UBM structure.

18. The semiconductor structure of claim 14, wherein the UBM structure comprises a Ti layer and a Cu layer.

19. The semiconductor structure of claim 14, further comprising a conductive pillar on the UBM structure, and a conductive bump on the conductive pillar.

20. The semiconductor structure of claim 19, further comprising a conductive cap interposed between the conductive pillar and the conductive bump.

* * * * *